(12) United States Patent
Sakai et al.

(10) Patent No.: US 8,134,168 B2
(45) Date of Patent: Mar. 13, 2012

(54) GROUP-III NITRIDE SEMICONDUCTOR DEVICE

(75) Inventors: Hiromitsu Sakai, Chiba (JP); Mineo Okuyama, Chiba (JP)

(73) Assignee: Showa Denko K.K., Tokyo (JP)

( * ) Notice: Subject to any disclaimer, the term of this patent is extended or adjusted under 35 U.S.C. 154(b) by 256 days.

(21) Appl. No.: 10/575,625

(22) PCT Filed: Oct. 13, 2004

(86) PCT No.: PCT/JP2004/015456
§ 371 (c)(1),
(2), (4) Date: Apr. 13, 2006

(87) PCT Pub. No.: WO2005/036658
PCT Pub. Date: Apr. 21, 2005

(65) Prior Publication Data
US 2007/0126009 A1 Jun. 7, 2007

Related U.S. Application Data

(60) Provisional application No. 60/513,596, filed on Oct. 24, 2003.

(30) Foreign Application Priority Data

Oct. 14, 2003 (JP) .................................. 2003-354237

(51) Int. Cl.
*H01L 33/00* (2010.01)
*H01L 31/0328* (2006.01)
*H01L 31/072* (2006.01)

(52) U.S. Cl. .............. 257/94; 257/96; 257/97; 257/190; 257/E33.028

(58) Field of Classification Search .................. 257/190, 257/94, 96, 97, E33.028
See application file for complete search history.

(56) References Cited

U.S. PATENT DOCUMENTS

| 5,192,987 A | 3/1993 | Khan et al. |
| 5,990,495 A * | 11/1999 | Ohba ............................. 257/94 |
| 6,165,812 A | 12/2000 | Ishibashi et al. |
| 6,242,764 B1 | 6/2001 | Ohba et al. |
| 6,462,357 B1 * | 10/2002 | Tsai et al. ........................ 257/97 |

(Continued)

FOREIGN PATENT DOCUMENTS

EP 0732754 A2 9/1996

(Continued)

OTHER PUBLICATIONS

T. S. Zheleva, et al., "Pendeo-Epitaxy—A New Approach for Lateral Growth of Gallium Nitride Structures", MRS Internet J. Nitride Semicond. Res. 4S1, G3.38 (1999).

(Continued)

*Primary Examiner* — Shouxiang Hu
(74) *Attorney, Agent, or Firm* — Sughrue Mion, PLLC

(57) ABSTRACT

An object of the present invention is to provide a Group III nitride semiconductor element which comprises a thick AlGaN layer exhibiting high crystallinity and containing no cracks, and which does not include a thick GaN layer (which generally serves as a light-absorbing layer in an ultraviolet LED).
The inventive Group III nitride semiconductor element comprises a substrate; a first nitride semiconductor layer composed of AlN which is provided on the substrate; a second nitride semiconductor layer composed of $Al_{x1}Ga_{1-x1}N$ ($0 \leq x1 \leq 0.1$) which is provided on the first nitride semiconductor layer; and a third nitride semiconductor layer composed of $Al_{x2}Ga_{1-x2}N$ ($0 < x2 < 1$ and $x1 + 0.02 \leq x2$) which is provided on the second nitride semiconductor layer.

14 Claims, 3 Drawing Sheets

U.S. PATENT DOCUMENTS

| | | | |
|---|---|---|---|
| 6,475,923 B1 * | 11/2002 | Mitamura | 438/758 |
| 6,504,183 B1 * | 1/2003 | Chang et al. | 257/103 |
| 6,534,791 B1 | 3/2003 | Hayashi et al. | |
| 2001/0055324 A1 | 12/2001 | Ota | |
| 2002/0056840 A1 | 5/2002 | Tsai et al. | |
| 2002/0155682 A1 | 10/2002 | Shibata et al. | |
| 2003/0016526 A1 | 1/2003 | Sakai et al. | |
| 2003/0136333 A1 | 7/2003 | Semond et al. | |
| 2003/0207125 A1 * | 11/2003 | Sunakawa et al. | 428/428 |

FOREIGN PATENT DOCUMENTS

| | | |
|---|---|---|
| EP | 1 160 882 A2 | 12/2001 |
| JP | 8-203834 | 8/1996 |
| JP | 2002-170991 A | 6/2002 |
| JP | 2003-133246 A | 5/2003 |
| JP | 2003-218396 | 7/2003 |

OTHER PUBLICATIONS

T. Takeuchi, et al: "Improvement of far-field pattern in nitride laser diodes", Applied Physics Letters, AIP, American Institute of Physics, Melville, NY, US LNKD- DOI:10.1063/1.125201, vol. 75, No. 19, Nov. 8, 1999, pp. 2960-2962, XP012023940 ISSN: 0003-6951 p. 2960, col. 2, line 8—p. 2961, col. 1, line 8; figures 1, 2, 4 p. 2962, col. 1, lines 3-9.

C. Adelmann, et al: "Atomic-layer epitaxy of GaN quantum wells and quantum dots on (0001) AlN", Journal of Applied Physics, American Institute of Physics. New York, US LNKD-DOI:10.1063/1.1458049, vol. 91, No. 8, Apr. 15, 2002, pp. 5498-5500, XP012056297 ISSN: 0021-8979 p. 5498, col. 2, lines 7-9 p. 5499, col. 1, lines 14-28; figure 1b p. 5499, col. 2, line 26—p. 5500, col. 1, line 9; figures 3a,b p. 5500, col. 2, lines 6-8, 13, 14.

M. Miyamura, et al: "Stranski-Krastanow growth of GaN quantum dots by metalorganic chemical vapor deposition", Journal of Crystal Growth, Elsevier, Amsterdam, NL LNKD-DOI:10.1016/S0022-0248(01)02058-9, vol. 237-239, Apr. 1, 2002, pp. 1316-1319, XP004355989 ISSN: 0022-0248 p. 1317, col. 1, lines 7-13 p. 1317, col. 1, line 20—col. 2, line 25; figures 2b, 2c, 3 p. 1318, col. 1, line 11—p. 1319, col. 1, line 11; figure 4.

D. Huang, et al: "Defect reduction with quantum dots in GaN grown on sapphire substrates by molecular beam epitaxy", Applied Physics Letters, AIP, American Institute of Physics, Melville, NY, US LNKD-DOI:10.1063/1.1432445, vol. 80, No. 2, Jan. 14, 2002, pp. 216-218, XP012030887 ISSN: 0003-6951 abstract p. 216, col. 2, line 36—p. 217, col. 1, line 27 p. 217, col. 1, line 54—p. 218, col. 1, line 26; figures 1-3.

* cited by examiner

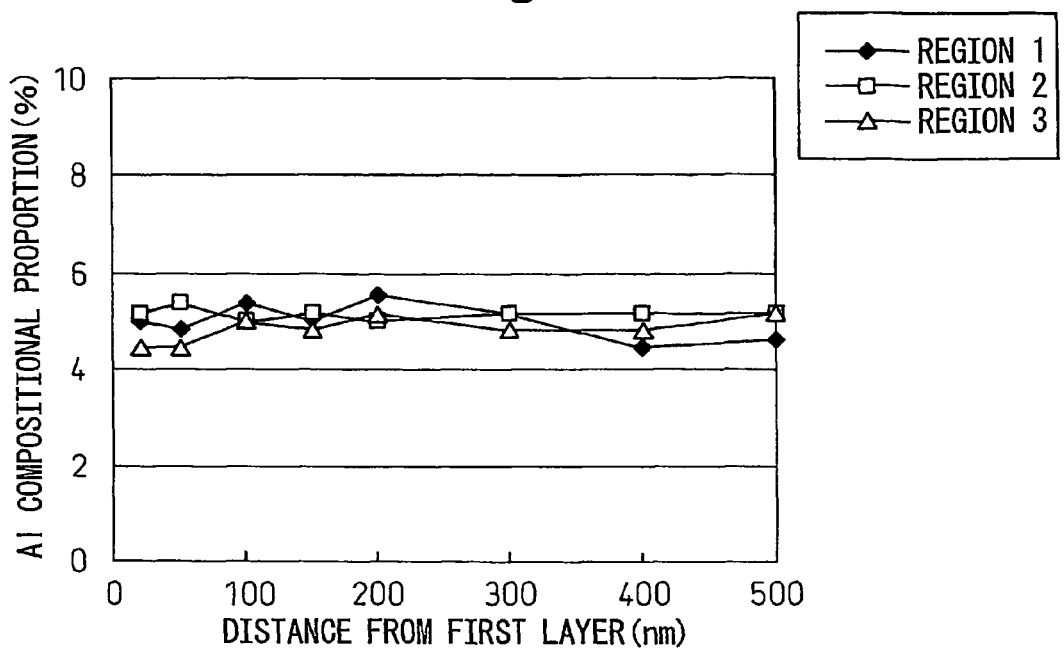
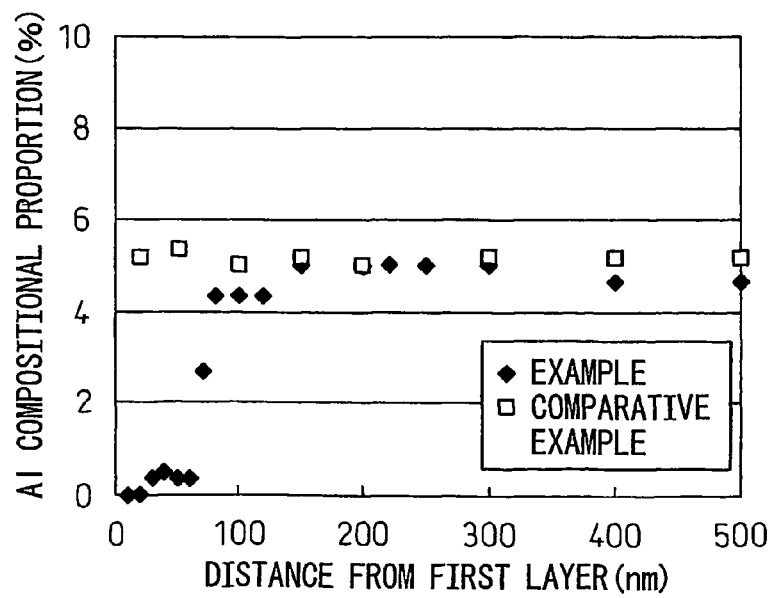

GROUP-III NITRIDE SEMICONDUCTOR DEVICE

CROSS REFERENCE TO RELATED APPLICATION

This application is an application filed under 35 U.S.C. §111(a) claiming benefit pursuant to 35 U.S.C. §119(e) (1) of the filing date of the Provisional Application No. 60/513,596 filed on Oct. 24, 2003, pursuant to 35 U.S.C. §111(b).

TECHNICAL FIELD

The present invention relates to a Group III nitride semiconductor element employed in electronic devices, including light-emitting devices such as a light-emitting diode (LED) and a laser diode (LD), light-receiving devices such as an optical sensor, and transistors. More particularly, the present invention relates to a Group III nitride semiconductor element useful for producing light-emitting devices which emit ultraviolet light (i.e., light having a wavelength of 380 nm or less).

BACKGROUND ART

GaN (gallium nitride) compound semiconductors have already been put into practical use in, for example, blue light-emitting diodes (LEDs). In general, a GaN compound semiconductor is grown, on a substrate formed of sapphire (i.e., a lattice mismatching material), through metal organic chemical vapor deposition (MOCVD) by use of an organometallic compound serving as a Group III element source and ammonia ($NH_3$) serving as a Group V element source. However, in the case where a GaN semiconductor layer is formed directly on a sapphire substrate, blue light of high emission intensity fails to be obtained, since the GaN semiconductor layer exhibits very poor crystallinity and surface morphology. In an attempt to solve problems involved in such lattice mismatching semiconductor growth, there has been proposed a technique for growing an AlN buffer layer at a low temperature of about 400° C. between a sapphire substrate and a GaN semiconductor layer. According to this technique, the GaN semiconductor layer, which is grown on the buffer layer, is improved in crystallinity and surface morphology (Japanese Patent Application Laid-Open (kokai) No. 2-229476). Meanwhile, an attempt has been made to develop a technique which does not employ the aforementioned low-temperature buffer layer growth technique (International Publication No. 02/17369 Pamphlet).

However, even when a GaN semiconductor layer is formed through such a technique, the semiconductor layer exhibits a dislocation density of $10^8$ to $10^{10}$ cm$^{-2}$. Dislocations are considered to serve as nuclei for non-radiative recombination. Particularly, in the case of an ultraviolet LED, which emits short-wavelength light (wavelength of 380 nm or less), dislocations greatly affect emission efficiency, and therefore the dislocation density must be reduced. In an ultraviolet LED, light whose energy is nearly equal to the bandgap of GaN (3.4 eV) is emitted from the light-emitting layer, and thus a considerable amount of the emitted light is absorbed by a GaN semiconductor layer which underlies the light-emitting layer; i.e., the GaN semiconductor layer exhibits the light absorption effect. Suppression of such light absorption requires a technique for lamination of a thick layer of an aluminum gallium nitride (AlGaN) semiconductor, which has a larger bandgap.

In the case of an AlGaN semiconductor layer, difficulty is encountered in growing crystals of high quality, as compared with the case of a GaN semiconductor layer, which is generally employed in, for example, a blue LED. Therefore, the crystallinity of the AlGaN semiconductor layer is lower than that of the GaN semiconductor layer. When an Al-containing Group III nitride semiconductor underlying layer is formed on a substrate, misfit dislocations are generated as a result of the difference in lattice constant between the substrate and the underlying layer, and the thus-generated misfit dislocations thread through the underlying layer and reach the surface thereof. Therefore, high-density dislocations, attributed to the misfit dislocations, are generated in Group III nitride semiconductor layers which are to be provided on the Group III nitride semiconductor underlying layer formed on the substrate. In order to suppress generation of such misfit dislocations in the Al-containing Group III nitride semiconductor layer (e.g., an AlGaN semiconductor layer), in general, a low-temperature buffer layer is formed between the substrate and the Group III nitride semiconductor layer through the above-described low-temperature buffer layer growth technique, thereby reducing the effect caused by the aforementioned lattice constant difference (e.g., Japanese Patent Application Laid-Open (kokai) No. 6-196757).

However, even in the case where such a low-temperature buffer layer is provided, the resultant Al-containing Group III nitride semiconductor layers, which constitute a semiconductor element, exhibit a high dislocation density (about $10^{10}$ cm$^{-2}$); i.e., low crystallinity. Therefore, when a semiconductor light-emitting device (i.e., an ultraviolet LED) is produced from the semiconductor element, the resultant semiconductor light-emitting device exhibits lowered emission efficiency; i.e., the device fails to attain intended characteristics.

In view of the foregoing, there has been proposed a technique in which a thick GaN layer (thickness: about 8 μm) is formed, at a high temperature, atop a sapphire substrate via a low-temperature buffer layer, and an AlGaN layer is grown on the GaN layer (Ito, et al., "PREPARATION OF AlxGa1-xN/GaN HETEROSTRUCTURE BY MOVPE," J. Cryst. Growth, 104 (1990), 533-538). In connection with this technique, there has been proposed a technique in which the thick GaN layer and the sapphire substrate are removed through polishing after growth of the AlGaN layer, to thereby form a GaN-free AlGaN layer (Morita, et al., "High Output Power 365 nm Ultraviolet Light-Emitting Diode of GaN-Free Structure," Jpn. J. Appl. Phys. Vol. 41 (2002), 1434-1436).

However, in the case where an AlGaN layer is grown on a thick GaN layer, since the lattice constant of GaN differs from that of AlGaN, once the elastic limit has been surpassed, cracking occurs in the AlGaN layer. Therefore, difficulty is encountered in growing crack-free crystals of high quality. Particularly when the mol fraction of AlN in the AlGaN layer or the thickness of the AlGaN layer is increased, such cracking may become considerable. When an LED is produced from the thus-formed semiconductor structure, the light absorption effect of the thick GaN layer would cause problems. Meanwhile, removal of the thick GaN layer and the sapphire substrate after growth of the AlGaN layer leads to very poor productivity.

DISCLOSURE OF INVENTION

In order to solve the aforementioned problems, an object of the present invention is to provide a Group III nitride semiconductor element which comprises a thick AlGaN layer exhibiting high crystallinity and containing no cracks, and which does not include a thick GaN layer (which generally serves as a light-absorbing layer in an ultraviolet LED).

The present invention provides the following.
(1) A Group III nitride semiconductor element comprising a substrate; a first nitride semiconductor layer composed of AlN which is provided on the substrate; a second nitride semiconductor layer composed of $Al_{x1}Ga_{1-x1}N$ ($0 \leq x1 \leq 0.1$) which is provided on the first nitride semiconductor layer; and a third nitride semiconductor layer composed of $Al_{x2}Ga_{1-x2}N$ ($0<x2<1$ and $x1+0.02 \leq x2$) which is provided on the second nitride semiconductor layer.
(2) A Group III nitride semiconductor element according to (1) above, wherein the substrate is selected from a group consisting of sapphire single crystal, Si single crystal, SiC single crystal, AlN single crystal, and GaN single crystal
(3) A Group III nitride semiconductor element according to (1) or (2) above, wherein the second nitride semiconductor layer is formed of an island-like structure in which crystals of different heights are arranged so as to be separated from one another.
(4) A Group III nitride semiconductor element according to any one of (1) through (3) above, wherein the second nitride semiconductor layer contains a region having a low Al content and a region having a high Al content.
(5) A Group III nitride semiconductor element according to any one of (1) through (4) above, wherein the second nitride semiconductor layer is composed of $Al_{x1}Ga_{1-x1}N$ ($0 \leq x1 \leq 0.05$).
(6) A Group III nitride semiconductor element according to (5) above, wherein the second nitride semiconductor layer is composed of $Al_{x1}Ga_{1-x1}N$ ($0 \leq x1 \leq 0.02$).
(7) A Group III nitride semiconductor element according to any one of (1) through (6) above, wherein the second nitride semiconductor layer has a thickness of 1 to 500 nm.
(8) A Group III nitride semiconductor element according to (7) above, wherein the second nitride semiconductor layer has a thickness of 1 to 400 nm.
(9) A Group III nitride semiconductor element according to (8) above, wherein the second nitride semiconductor layer has a thickness of 1 to 300 nm.
(10) A Group III nitride semiconductor element according to any one of (1) through (9) above, wherein the second nitride semiconductor layer is composed of an undoped semiconductor.
(11) A Group III nitride semiconductor light-emitting device comprising a Group III nitride semiconductor element as recited in any one of (1) through (10) above; a fourth nitride semiconductor layer provided on the third nitride semiconductor layer of the semiconductor element, the fourth nitride semiconductor layer including an n-type layer, a light-emitting layer, and a p-type layer, which are successively formed atop the third nitride semiconductor layer in this order; a negative electrode provided on the n-type layer; and a positive electrode provided on the p-type layer.
(12) A light-emitting diode comprising a Group III nitride semiconductor light-emitting device as recited in (11) above.
(13) A laser diode comprising a Group III nitride semiconductor light-emitting device as recited in (11) above.
(14) A semiconductor device comprising a Group III nitride semiconductor element as recited in any one of (1) through (10) above.

According to the present invention, there is obtained a semiconductor element which comprises a thick AlGaN layer having low dislocation density and containing no cracks, and which does not include a thick GaN layer. Since the semiconductor element does not include a thick GaN layer, when an ultraviolet light-emitting device is produced from the semiconductor element, light absorption can be suppressed, and emission intensity is enhanced.

The semiconductor element does not require any treatment after growth of the AlGaN layer, and thus the element can be produced at high productivity.

BRIEF DESCRIPTION OF DRAWINGS

FIG. 5 is a graph showing data of Al compositional proportion as measured in different regions of the Group III nitride semiconductor device produced in the Comparative Example.

FIG. 6 is a graph showing comparison between data of Al compositional proportion as measured in the Group III nitride semiconductor device of Example 1 and data of Al compositional proportion as measured in the Group III nitride semiconductor device of the Comparative Example.

BEST MODE FOR CARRYING OUT THE INVENTION

Figure 1:
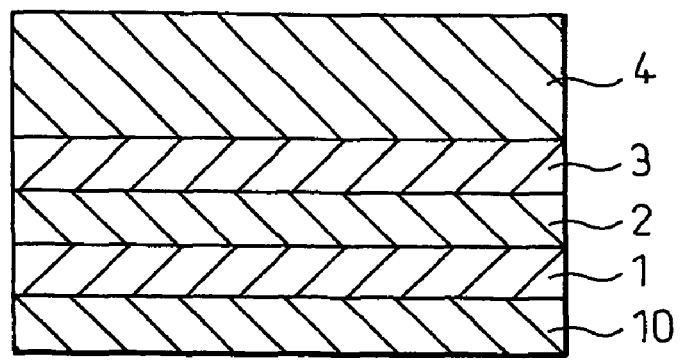
FIG. 1 is a schematic cross-sectional view showing an example of the Group III nitride semiconductor element of the present invention.

FIG. 1 is a schematic representation showing an example of the Group III nitride semiconductor element of the present invention. In FIG. 1, reference numeral 10 denotes a substrate, 1 a first nitride semiconductor layer composed of AlN, 2 a second nitride semiconductor layer composed of $Al_{x1}Ga_{1-x1}N$ ($0 \leq x1 \leq 0.1$), and 3 a third nitride semiconductor layer composed of $Al_{x2}Ga_{1-x2}N$ ($0<x2<1$ and $x1+0.02 \leq x2$). The substrate and the semiconductor layers constitute the Group III nitride semiconductor element of the present invention. When a semiconductor device is produced from the Group III nitride semiconductor element, a fourth nitride semiconductor layer 4, whose configuration is appropriately determined in accordance with the intended use of the device, is provided on the third nitride semiconductor layer.

No particular limitations are imposed on the method for growing these Group III nitride semiconductor layers, and there may be employed any known method for growing a Group III nitride semiconductor, such as MOCVD (metal organic chemical vapor deposition), HVPE (hydride vapor phase epitaxy), or MBE (molecular beam epitaxy). From the viewpoints of layer thickness controllability and mass productivity, MOCVD is preferably employed. In the case where the Group III nitride semiconductor layers are grown by means of MOCVD, hydrogen ($H_2$) or nitrogen ($N_2$) is employed as a carrier gas, trimethylgallium (TMG) or triethylgallium (TEG) is employed as a Ga (Group III element) source, trimethylaluminum (TMA) or triethylaluminum (TEA) is employed as an Al (Group III element) source, trimethylindium (TMI) or triethylindium (TEI) is employed as an In (Group III element) source, and ammonia ($NH_3$), hydrazine ($N_2H_4$), or the like is employed as an N (Group V element) source. In addition, monosilane ($SiH_4$) or disilane ($Si_2H_6$) serving as an Si source, or germane ($GeH_4$) serving as a Ge source is employed as an n-type dopant, whereas bis (cyclopentadienyl)magnesium (Cp$_2$Mg) or bis(ethylcyclopentadienyl)magnesium (EtCp$_2$Mg) serving as an Mg source is employed as a p-type dopant.

No particular limitations are imposed on the material of the substrate, and the substrate may be formed of any known material. Examples of the known material include oxide single crystals such as sapphire single crystal (Al$_2$O$_3$; A-plane, C-plane, M-plane, or R-plane), spinel single crystal (MgAl$_2$O$_4$), ZnO single crystal, LiAlO$_2$ single crystal, LiGaO$_2$ single crystal, and MgO single crystal; Si single crystal; SiC single crystal; GaAs single crystal; AlN single crystal; GaN single crystal; and boride single crystals such as ZrB$_2$ single crystal. In these material, sapphire single crystal, Si single crystal, SiC single crystal, AlN single crystal and GaN single crystal are preferable. No particular limitations are imposed on the crystal orientation of the substrate. The substrate may be an on-axis substrate or a substrate having an off-angle.

The first nitride semiconductor layer composed of AlN, which is provided on the substrate, serves as a buffer layer. The thickness of the first nitride semiconductor layer is preferably 0.001 to 1 μm, more preferably 0.005 to 0.5 μm, particularly preferably 0.01 to 0.2 μm. When the thickness of the first nitride semiconductor layer falls within the above range, the nitride semiconductor layers (including the second nitride semiconductor layer) to be grown atop the first nitride semiconductor layer exhibit excellent crystal morphology and improved crystallinity.

The first nitride semiconductor layer can be formed through MOCVD by use of TMA serving as an Al source and NH$_3$ serving as an N source. The layer growth temperature is preferably 400 to 1,200° C., more preferably 900 to 1,200° C. When the layer growth temperature falls within the above range, the thus-grown first nitride semiconductor layer is composed of AlN single crystal, and the nitride semiconductor layer to be grown thereon exhibits high crystallinity, which is preferable. The amounts of H$_2$ (serving as a carrier gas), NH$_3$, and TMA, which are fed into an MOCVD growth furnace, are regulated to 15 to 30 l/minute, 0.5 to 2 l/minute, and 40 to 100 μmol/minute, respectively. The pressure in the MOCVD growth furnace is regulated to 15 to 30 kPa.

When the substrate is composed of AlN single crystal, the AlN substrate also serves as the first nitride semiconductor layer.

The second nitride semiconductor layer is required for reducing the dislocation density of AlGaN crystals constituting the third nitride semiconductor layer to be grown on the second nitride semiconductor layer.

In the case of AlGaN crystal growth, small crystal grains (columnar crystal grains) are more apt to be formed, as compared with the case of GaN crystal growth, since the reactivity between Al and NH$_3$ is high, and migration of Al tends not to occur. Therefore, the dislocation density of the resultant AlGaN crystals tends to become high. In the case where a GaN layer is formed through MOCVD, the thickness of the layer must be regulated to 1 to 2 μm for attaining surface planarization (continuous layer formation), although the required layer thickness varies depending on the GaN growth conditions. In the initial stage of GaN crystal growth, GaN crystals form island-like structures which are separated from one another, rather than forming a continuous layer. Thereafter, as the thickness of the island-like structures increases, horizontal crystal growth proceeds, and the island-like structures are combined together, thereby forming a planar continuous layer (hereinafter, such a growth mode dominated by horizontal crystal growth may be referred to as the "GaN growth mode"). In contrast, in the case of AlGaN crystal growth, surface planarization is rapidly attained, as compared with the case of GaN crystal growth; i.e., surface planarization is attained in the initial stage of crystal growth (hereinafter, such a growth mode dominated by vertical crystal growth may be referred to as the "AlGaN growth mode").

The present inventors have found that an increase in the dislocation density of AlGaN crystals is caused by the difference between the GaN growth mode and the AlGaN growth mode. In AlGaN crystals, whose growth is dominated by the vertical growth mode, dislocations are readily generated. In contrast, in GaN crystals, whose growth is dominated by the horizontal growth mode, generation of dislocations is suppressed, as compared with the case of AlGaN crystals.

Through provision of the second nitride semiconductor layer, the initial growth of AlGaN crystals constituting the third nitride semiconductor layer is dominated by the GaN growth mode, whereby the dislocation density of the resultant crystals is reduced, and the crystallinity thereof is improved. That is, a critical point for reducing the dislocation density of AlGaN crystals is that the initial growth of the AlGaN crystals is dominated by the GaN growth mode. Without provision of the second nitride semiconductor layer, the initial growth of AlGaN crystals constituting the third nitride semiconductor layer is dominated by the AlGaN growth mode, and therefore the dislocation density of the resultant crystals is increased, and the crystallinity thereof is impaired.

In order to attain the initial growth of AlGaN crystals (constituting the third nitride semiconductor layer) by means of the GaN growth mode, in Al$_{x1}$Ga$_{1-x1}$N crystals constituting the second nitride semiconductor layer, x1 preferably falls within a range of $0 \leq x1 \leq 0.1$, more preferably $0 \leq x1 \leq 0.05$, particularly preferably $0 \leq x1 \leq 0.02$. When x1 is greater than 0.1, growth of the third nitride semiconductor layer is dominated by the AlGaN growth mode, and thus the dislocation density of the third nitride semiconductor layer fails to be reduced. When the structure of the second nitride semiconductor layer is similar to that of GaN, the resultant third nitride semiconductor layer tends to exhibit high crystallinity.

In order to attain the initial growth of AlGaN crystals (constituting the third nitride semiconductor layer) by means of the GaN growth mode, preferably, the second nitride semiconductor layer is formed, not of a planar continuous layer, but of an island-like structure in which crystals of different heights are arranged so as to be separated from one another.

Figure 4:
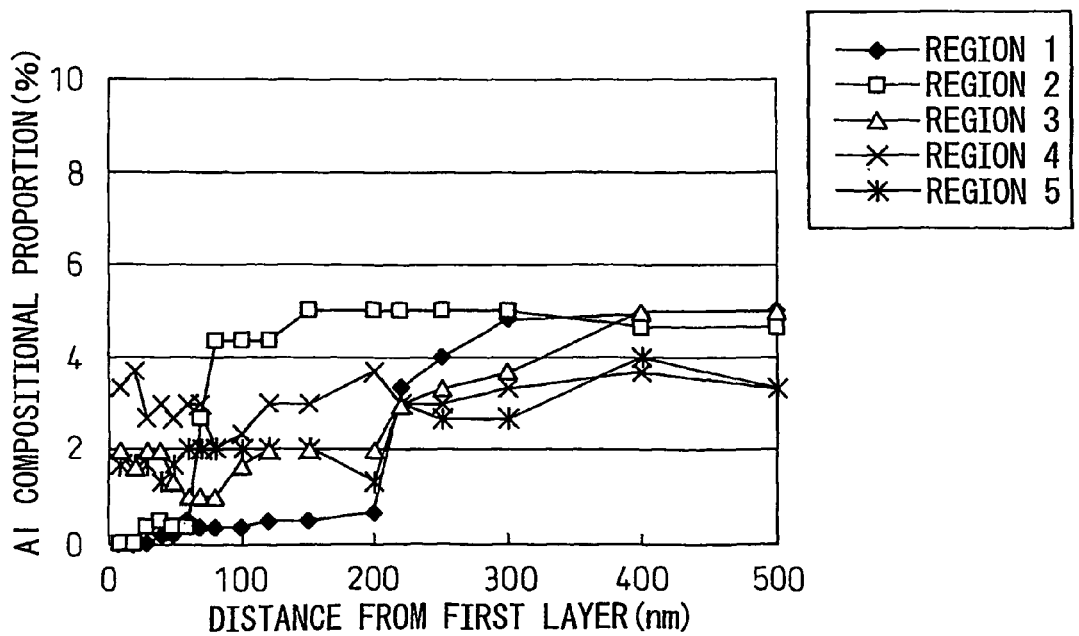
FIG. 4 is a graph showing data of Al compositional proportion as measured in different regions of the Group III nitride semiconductor device produced in Example 1.

FIG. 4 is a graph showing the results of analysis of the compositional proportion of Al contained in different regions of the second and third nitride semiconductor layers constituting the Group III nitride semiconductor element produced in Example 1, wherein data of Al compositional proportion are plotted with respect to the distance from the first nitride semiconductor layer. For example, in a region 1, the Al content is increased at a position about 220 nm distant from the first nitride semiconductor layer, whereas in a region 2, the Al content is increased at a position about 70 nm distant from the first nitride semiconductor layer. Meanwhile, in a region 4, reduction of the Al content is not observed. Therefore, AlGaN crystals having low Al content, which constitute the second nitride semiconductor layer, are not present in the region 4. In contrast, in the region 1, the second nitride semiconductor layer has a thickness of about 220 nm, whereas in the region 2, the second nitride semiconductor layer has a thickness of about 70 nm. The second nitride semiconductor layer preferably has such an island-like structure.

The thickness of the second nitride semiconductor layer is preferably 1 to 500 nm, more preferably 1 to 400 nm, particularly preferably 1 to 300 nm. When the thickness is smaller than 1 nm, the second nitride semiconductor layer fails to exhibit the effect of reducing the dislocation density of the third nitride semiconductor layer. In contrast, when the thickness exceeds 500 nm, cracking may occur in the third nitride semiconductor layer, or an ultraviolet LED produced from the resultant semiconductor element may raise problems in terms of light absorption.

As described above, preferably, the second nitride semiconductor layer is formed, not of a planar continuous layer, but of an island-like structure in which crystals of different heights are arranged so as to be separated from one another. As used herein, the thickness of the second nitride semiconductor layer is defined by the thickness of a region containing the crystal of largest height. According to this definition, the second nitride semiconductor layer contains a region having a high Al content and a region having a low Al content. Therefore, the composition of AlGaN constituting the second nitride semiconductor layer is represented by the average composition of AlGaN crystals contained in different regions of the layer.

The temperature for growth of the second nitride semiconductor layer is preferably regulated to 800 to 1,200° C., more preferably 1,000 to 1,200° C. When the second nitride semiconductor layer is grown within the above temperature range, the third nitride semiconductor layer to be grown thereon exhibits high crystallinity. $H_2$ (serving as a carrier gas), $NH_3$, TMG, and TMA are fed into an MOCVD growth furnace in amounts of 10 to 20 l/minute, 2 to 4 l/minute, 20 to 100 μmol/minute, and 0 to 30 μmol/minute, respectively. The pressure in the MOCVD growth furnace is regulated to 15 to 40 kPa.

In $Al_{x2}Ga_{1-x2}N$ constituting the third nitride semiconductor layer, x2 preferably falls within a range of 0<x2<1, more preferably $0.02 \leq x2 \leq 0.5$, particularly preferably $0.02 \leq x2 \leq 0.1$. When x2 falls within the above range, the third nitride semiconductor layer exhibits high crystallinity and low dislocation density. In addition to the aforementioned conditions, in the second and third nitride semiconductor layers, x1 and x2; i.e., the compositional proportions of Al, preferably satisfy the following relation: $x1+0.02 \leq x2$, and preferably, the Al content of the third nitride semiconductor layer is higher than that of the second nitride semiconductor layer. When the Al content of the second nitride semiconductor layer is regulated to be lower than that of the third nitride semiconductor layer, the dislocation density of the third nitride semiconductor layer can be reduced.

No particular limitations are imposed on the thickness of the third nitride semiconductor layer, but the thickness is preferably 0.1 to 20 μm, more preferably 1 to 10 μm. When the thickness is regulated to 1 μm or more, the resultant AlGaN layer tends to exhibit high crystallinity.

The third nitride semiconductor layer may be doped with Si (i.e., an n-type impurity), so long as the Si content falls within a range of $1 \times 10^{17}$ to $1 \times 10^{19}/cm^3$. However, preferably, the third nitride semiconductor layer is undoped (i.e., the impurity content is lower than $1 \times 10^{17}/cm^3$), from the viewpoint of maintenance of high crystallinity. No particular limitations are imposed on the n-type impurity, and, for example, Si or Ge may be employed, with Si being preferred.

The temperature for growth of the third nitride semiconductor layer is preferably regulated to 800 to 1,200° C., more preferably 1,000 to 1,200° C. When the third nitride semiconductor layer is grown within the above temperature range, the layer exhibits high crystallinity. $H_2$ (serving as a carrier gas), $NH_3$, TMG, and TMA are fed into an MOCVD growth furnace in amounts of 10 to 25 l/minute, 2 to 5 l/minute, 100 to 250 μmol/minute, and 5 to 100 μmol/minute, respectively. The pressure in the MOCVD growth furnace is regulated to 15 to 40 kPa.

The first through third nitride semiconductor layers may contain, in addition to Al and Ga, a Group III element such as In. If desired, these layers may contain an element such as Ge, Si, Mg, Ca, Zn, Be, P, As, or B. In some cases, these layers contain, in addition to an intentionally added element, inevitable impurities attributed to, for example, the layer growth conditions, as well as trace amounts of impurities contained in the raw materials or the material of a reaction tube.

Figure 2:
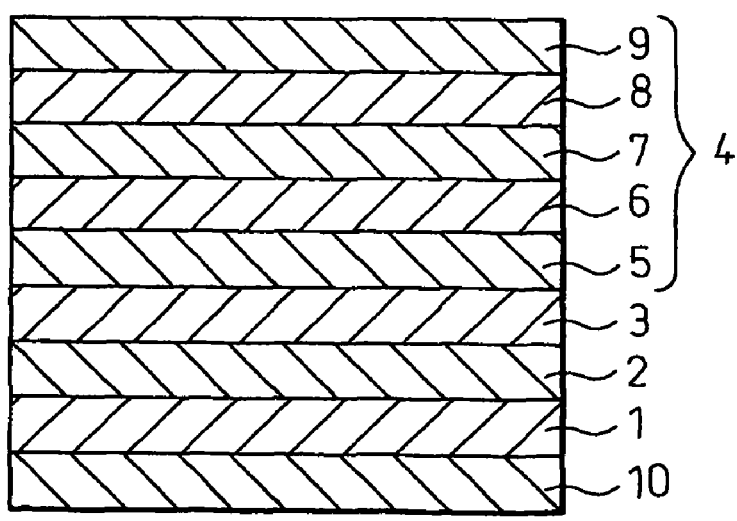
FIG. 2 is a cross-sectional view showing an example of a semiconductor device employing the Group III nitride semiconductor element of the present invention.

The configuration of the fourth nitride semiconductor layer is appropriately determined in accordance with the intended use of the resultant semiconductor device. Next will be described the case where the semiconductor device is an ultraviolet light-emitting device. FIG. 2 is a schematic representation showing an example of the semiconductor device. The fourth nitride semiconductor layer 4 includes an n-type contact layer 5, an n-type cladding layer 6, a light-emitting layer 7, a p-type cladding layer 8, and a p-type contact layer 9.

The n-type contact layer 5 is a nitride semiconductor layer composed of $Al_aGa_{1-a}N$ (0<a<1, preferably 0<a<0.5, more preferably 0.01<a<0.1). When the Al compositional proportion falls within the above range, light absorption can be suppressed, and high crystallinity and good ohmic contact can be attained. The n-type dopant content of the contact layer is $1 \times 10^{17}$ to $1 \times 10^{19}/cm^3$, preferably $1 \times 10^{18}$ to $1 \times 10^{19}/cm^3$. When the n-type dopant content falls within the above range, good ohmic contact can be maintained, occurrence of cracking can be suppressed, and high crystallinity can be maintained. No particular limitations are imposed on the thickness of the n-type contact layer, but the thickness is preferably 0.1 to 10 μm, more preferably 1 to 5 μm. When the thickness falls within the above range, high crystallinity can be maintained, and the operation voltage of the semiconductor device can be reduced.

No particular limitations are imposed on the composition of the n-type cladding layer 6, so long as the cladding layer has a bandgap energy greater than that of the light-emitting layer, and the cladding layer enables confinement of carriers in the light-emitting layer. Preferably, the n-type cladding layer is composed of $Al_bGa_{1-b}N$ (0<b<0.4, preferably 0.1<b<0.2), from the viewpoint of confinement of carriers in the light-emitting layer. No particular limitations are imposed on the thickness of the n-type cladding layer, but the thickness is preferably 0.01 to 0.4 μm, more preferably 0.01 to 0.1 μm. The n-type dopant content of the n-type cladding layer is preferably $1 \times 10^{17}$ to $1 \times 10^{20}/cm^3$, more preferably $1 \times 10^{18}$ to $1 \times 10^{19}/cm^3$. When the n-type dopant content falls within the above range, high crystallinity can be maintained, and the operation voltage of the semiconductor device can be reduced.

The light-emitting layer 7 is formed of a nitride semiconductor layer which emits light having a peak wavelength of 390 nm or less (preferably 380 nm or less). Preferably, the light-emitting layer is composed of a $Ga_{1-s}In_sN$ (0<s<0.1) layer. No particular limitations are imposed on the thickness of the light-emitting layer, so long as the quantum effect is obtained. The thickness is preferably 1 to 10 nm, more preferably 2 to 6 nm. When the thickness falls within the above range, high emission output can be attained. The light-emitting layer may have, instead of the aforementioned single quantum well (SQW) structure, a multiple quantum well (MQW) structure including the $Ga_{1-s}In_sN$ layer (serving as a well layer) and a $Al_cGa_{1-c}N$ ($0 \leq c<0.3$ and b>c) barrier layer, which has a bandgap energy greater than that of the well layer. The well layer or the barrier layer may be doped with an impurity.

The temperature for growth of the $Al_cGa_{1-c}N$ barrier layer is preferably 800° C. or higher, more preferably 900 to 1,200° C., from the viewpoint of attainment of high crystallinity. The GaInN well layer is grown at 600 to 900° C., preferably at 800 to 900° C. In order to attain high crystallinity of the MQW structure, preferably, the well layer and the barrier layer are grown at different temperatures.

No particular limitations are imposed on the composition of the p-type cladding layer 8, so long as the cladding layer has a bandgap energy greater than that of the light-emitting layer, and the cladding layer enables confinement of carriers in the light-emitting layer. Preferably, the p-type cladding layer is composed of $Al_dGa_{1-d}N$ ($0<d\leq0.4$, preferably $0.1\leq d\leq0.3$), from the viewpoint of confinement of carriers in the light-emitting layer. No particular limitations are imposed on the thickness of the p-type cladding layer, but the thickness is preferably 0.01 to 0.4 μm, more preferably 0.02 to 0.1 μm. The p-type dopant content of the p-type cladding layer is preferably $1\times10^{18}$ to $1\times10^{21}/cm^3$, more preferably $1\times10^{19}$ to $1\times10^{20}/cm^3$. When the p-type dopant content falls within the above range, excellent p-type crystals are grown without lowering of crystallinity.

The p-type contact layer 9 is a nitride semiconductor layer containing at least $Al_eGa_{1-e}N$ ($0\leq e<0.5$, preferably $0\leq e\leq0.1$, more preferably $0\leq e<0.05$). When the Al compositional proportion falls within the above range, high crystallinity can be maintained, and good ohmic contact can be attained. The p-type dopant content of the contact layer is $1\times10^{18}$ to $1\times10^{21}/cm^3$, preferably $5\times10^{19}$ to $5\times10^{20}/cm^3$. When the p-type dopant content falls within the above range, good ohmic contact can be maintained, occurrence of cracking can be prevented, and high crystallinity can be maintained. No particular limitations are imposed on the p-type dopant, but preferably, the p-type dopant is, for example, Mg. No particular limitations are imposed on the thickness of the p-type contact layer, but the thickness is preferably 0.01 to 0.5 μm, more preferably 0.05 to 0.2 μm. When the thickness falls within the above range, high emission output can be attained.

A negative electrode and a positive electrode are provided on the n-type contact layer 5 and the p-type contact layer 9, respectively, through a customary technique which is well known in the art, to thereby produce a Group III nitride semiconductor light-emitting device which emits ultraviolet light.

EXAMPLES

The present invention will next be described in more detail by way of Examples, which should not be construed as limiting the invention thereto. Analysis techniques employed in Examples are as follows.

Dislocation density was determined through observation under a transmission electron microscope (TEM).

The composition of a nitride semiconductor layer was determined by means of X-ray diffractometry. The compositional proportion of Al contained in a nitride semiconductor layer, which is shown on the vertical axis of each of the graphs of FIGS. 4 to 6, was determined through the following procedure: there was obtained a relation between the EDX intensity ratio of a thick AlGaN layer, as measured through EDX (energy dispersive X-ray spectroscopy), and the compositional proportion of Al contained in the AlGaN layer, as measured through X-ray diffractometry; and the compositional proportion of Al contained in different regions of the nitride semiconductor layer was calculated, by use of the relation, from the EDX intensity ratio as measured at the regions of the semiconductor layer.

Layer thickness was determined through magnified observation under a transmission electron microscope.

Example 1

Figure 3:
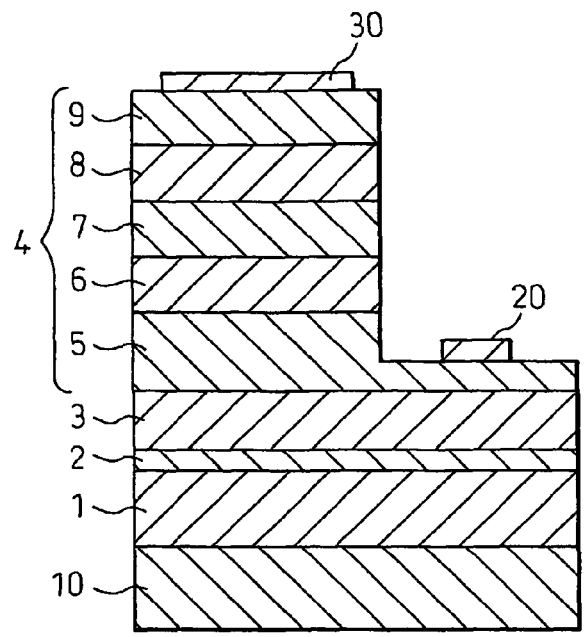
FIG. 3 is a schematic cross-sectional view showing the Group III nitride semiconductor light-emitting device produced in Example 1.

FIG. 3 is a schematic cross-sectional view showing the structure of the Group III nitride semiconductor light-emitting device produced in the present Example. The Group III nitride semiconductor light-emitting device shown in FIG. 3 was produced by successively forming semiconductor layers atop a sapphire substrate 10 through a well known MOCVD technique. The substrate 10 is a C-plane sapphire substrate having an off-angle of 0.2°. The sapphire substrate was placed in a reactor of an MOCVD growth furnace, and maintained in a hydrogen atmosphere at 1,000° C. for 10 minutes, thereby cleaning the sapphire substrate.

Subsequently, the temperature of a susceptor was increased to 1,180° C., and TMA (serving as an Al source) and $NH_3$ (serving as an N source) were fed into the growth furnace, to thereby grow a first nitride semiconductor layer 1 formed of AlN. Specifically, $H_2$ (serving as a carrier gas) (22 l/minute), $NH_3$ (0.5 l/minute), and TMA (80 μmol/minute) were fed into the MOCVD growth furnace, and the pressure in the growth furnace was regulated to 15 kPa, to thereby form the AlN layer having a thickness of about 30 nm. The AlN layer is provided for mitigating the lattice mismatching between the substrate and nitride semiconductor layers to be formed on the AlN layer.

After growth of the first nitride semiconductor layer, the temperature of the susceptor was maintained at 1,150° C., and TMG and $NH_3$ were fed into the growth furnace, to thereby form a GaN layer. Specifically, $H_2$ (serving as a carrier gas) (15 l/minute), $NH_3$ (2 l/minute), and TMG (50 μmol/minute) were fed into the MOCVD growth furnace, and the pressure in the growth furnace was regulated to 15 kPa, to thereby form a second nitride semiconductor layer 2. The thickness of the layer was determined to be about 220 nm (as shown in FIG. 4) on the basis of the aforementioned definition. The average composition of the second nitride semiconductor layer was found to be $Al_{0.018}Ga_{0.982}N$.

After formation of the second nitride semiconductor layer, the temperature of the susceptor was maintained at 1,150° C., and feeding of TMG was temporarily stopped. Thereafter, TMG and TMA were fed into the growth furnace, to thereby grow a third nitride semiconductor layer 3 (thickness: about 3 μm) composed of undoped $Al_{0.05}Ga_{0.95}N$. Specifically, $H_2$ (serving as a carrier gas) (15 l/minute), $NH_3$ (2 l/minute), TMG (150 μmol/minute), and TMA (20 μmol/minute) were fed into the MOCVD growth furnace, and the pressure in the growth furnace was regulated to 15 kPa.

After growth of the third nitride semiconductor layer, an n-type contact layer 5 (thickness: 1.5 m) composed of $Al_{0.05}Ga_{0.95}N$ doped with Si ($7\times10^{18}/cm^3$) was grown at a temperature of 1,180° C. from TMG, TMA, and silane ($SiH_4$) gas serving as a dopant gas. Specifically, $H_2$ (serving as a carrier gas) (15 l/minute), $NH_3$ (2 l/minute), TMG (150 μmol/minute), and TMA (20 μmol/minute) were fed into the MOCVD growth furnace, and the pressure in the growth furnace was regulated to 15 kPa.

After growth of the n-type contact layer, an n-type cladding layer 6 (thickness: 50 nm) composed of n-type $Al_{0.15}Ga_{0.85}N$ doped with Si ($5\times10^{18}/cm^3$) was grown at a temperature of 1,180° C. from TMG, TMA, NH$_3$, and SiH$_4$, serving as raw material gases. The n-type cladding layer serves as a carrier confinement layer.

Thereafter, a light-emitting layer 7 was grown from TEG, TMI, and SiH$_4$, serving as raw material gases, by use of N$_2$ serving as a carrier gas. Firstly, a barrier layer (thickness: 15 nm) composed of Al$_{0.1}$Ga$_{0.9}$N doped with Si ($5 \times 10^{17}$/cm$^3$) was grown at a temperature of 1,000° C.; and subsequently, a well layer (thickness: 5 nm) composed of undoped Ga$_{0.05}$In$_{0.95}$N was grown at a temperature of 800° C. This procedure was performed five times, and finally, a barrier layer was formed on the resultant laminate, to thereby yield an MQW structure. When the barrier layer is doped with an n-type impurity, emission output tends to be increased. On the outermost layer (i.e., barrier layer) of the light-emitting layer, a cap layer (thickness: 13 nm) composed of undoped Al$_{0.1}$Ga$_{0.9}$N was grown at 1,000° C.

Subsequently, a p-type cladding layer 8 (thickness: 50 nm) composed of p-type Al$_{0.25}$Ga0.75N doped with Mg ($1 \times 10^{20}$/cm$^3$) was grown at 1,100° C. Similar to the case of the n-type cladding layer, the p-type cladding layer serves as a carrier confinement layer. Finally, a p-type contact layer 9 (thickness: 0.1 µm) composed of p-type GaN doped with Mg ($5 \times 10^{19}$/cm$^3$) was grown on the p-type cladding layer at 1,100° C.

The dislocation density of the third nitride semiconductor layer was determined to be $9 \times 10^8$/cm$^2$; i.e., the third nitride semiconductor layer exhibited high crystallinity. The compositional proportion of Al contained in the second and third nitride semiconductor layers was measured at different regions. The results are shown in FIG. 4. As described above, the compositional proportion of Al contained in the second nitride semiconductor layer differs from region to region, and the second nitride semiconductor layer is formed, not of a planar continuous layer, but of an island-like structure in which crystals of different heights are arranged so as to be separated from one another. That is, the Al content of the second nitride semiconductor layer differs from region to region. The dislocation density of the third nitride semiconductor layer was found to be low at a region corresponding to a low-Al-content region present at the interface between the first and second nitride semiconductor layers, whereas the dislocation density of the third nitride semiconductor layer was found to be high at a region corresponding to a high-Al-content region present at the interface between the first and second nitride semiconductor layers.

A negative electrode 20 and a positive electrode 30 were provided on the n-type contact layer and the p-type contact layer, respectively, through a customary technique which is well known in the art, to thereby produce a Group III nitride semiconductor light-emitting device. When a forward current of 20 mA was applied to the light-emitting device, the device exhibited an emission output of 3.1 mW, and emitted light having a peak wavelength of 375 nm.

Example 2

In the present Example, a low-temperature AlN buffer layer was employed as the first nitride semiconductor layer 1. The temperature of the susceptor was regulated to 500° C., and TMA and NH$_3$ were fed into the MOCVD growth furnace, to thereby form the AlN buffer layer. Specifically, H$_2$ (serving as a carrier gas) (22 l/minute), NH$_3$ (0.5 l/minute), and TMA (80 µmol/minute) were fed into the MOCVD growth furnace, and the pressure in the growth furnace was regulated to 15 kPa, to thereby form the AlN buffer layer having a thickness of about 30 nm. The procedure of Example 1 was repeated, except that the thus-formed AlN buffer layer was employed as the first nitride semiconductor layer 1, to thereby produce a light-emitting diode device. The resultant light-emitting diode device exhibited characteristics comparable to those of the light-emitting diode device of Example 1.

Comparative Example

The procedure of Example 1 was repeated, except that the second nitride semiconductor layer 2 was not formed, to thereby produce a light-emitting diode device. When a current of 20 mA was applied to the light-emitting diode device, the device exhibited an emission output of 0.3 mW, and emitted light having a peak wavelength of 375 nm.

The dislocation density of the third nitride semiconductor layer was determined to be $5 \times 10^9$/cm$^2$; i.e., the third nitride semiconductor layer exhibited low crystallinity. In a manner similar to that of Example 1, the compositional proportion of Al contained in the second and third nitride semiconductor layers was measured at different regions. The results are shown in FIG. 5. As is clear from FIG. 5, the second nitride semiconductor layer of low Al content is not present, and the third nitride semiconductor layer of high Al content is in direct contact with the first nitride semiconductor layer.

FIG. 6 is a graph showing comparison between data of Al compositional proportion as measured in the second and third nitride semiconductor layers of the device of Example 1 and data of Al compositional proportion as measured in the third nitride semiconductor layer of the device of the Comparative Example, wherein the data of Al compositional proportion are plotted with respect to the distance from the first nitride semiconductor layer. A critical point is that a region having a low Al content is in contact with the first nitride semiconductor layer.

INDUSTRIAL APPLICABILITY

When the Group III nitride semiconductor element of the present invention is employed in an electronic device, such as a light-emitting device (e.g., a light-emitting diode or a laser diode), a light-receiving device (e.g., an optical sensor), or a transistor, the resultant device can attain very high efficiency. Therefore, the Group III nitride semiconductor element has very high industrial utility value.

The invention claimed is:

1. A Group III nitride semiconductor element comprising a substrate;
a first nitride semiconductor layer composed of AlN single crystal having a thickness of 0.005 to 0.5 µm which is provided on the substrate;
a second nitride semiconductor layer composed of Al$_{x1}$Ga$_{1-x1}$N($0<x1\leq0.05$) which is provided on the first nitride semiconductor layer;
a third nitride semiconductor layer composed of Al$_{x2}$Ga$_{1-x2}$N($x1+0.02 \leq x2 \leq 0.5$) which is provided on the second nitride semiconductor layer; and
a fourth nitride semiconductor layer which is provided on the third nitride semiconductor layer, the fourth nitride semiconductor layer including:
an n-type contact layer composed of Al$_a$Ga$_{1-a}$N ($0<a<1$),
an n-type cladding layer composed of Al$_b$Ga$_{1-b}$N ($0<b<0.4$) which is provided on the n-type contact layer, and
a light-emitting layer which has a multiple quantum well (MQW) structure including a well layer composed of Ga$_{1-s}$In$_s$N ($0<s<0.1$) and a barrier layer composed of Al$_c$Ga$_{1-c}$N$_c$($0 \leq c<0.3$ and $c<b$) doped with Si, and is provided on the n-type cladding layer.

2. A Group III nitride semiconductor element according to claim 1, wherein said substrate is selected from a group consisting of sapphire single crystal, Si single crystal, SiC single crystal, AlN single crystal, and GaN single crystal.

3. A Group III nitride semiconductor element according to claim 1, wherein said second nitride semiconductor layer is formed of an island-like structure in which crystals of different heights are arranged so as to be separated from one another.

4. A Group III nitride semiconductor element according to claim 3, wherein the Al content of said second nitride semiconductor layer differs from region to region of the island-like structure.

5. A Group III nitride semiconductor element according to claim 4, wherein the second nitride semiconductor layer has a region having a lower Al content at a position closer to the substrate and a higher Al content at a position farther from the substrate.

6. A Group III nitride semiconductor element according to claim 1, wherein said second nitride semiconductor layer is composed of $Al_{x1}Ga_{1-x1}N(0<x1\leqq0.02)$.

7. A Group III nitride semiconductor element according to claim 1, wherein said second nitride semiconductor layer has a thickness of 1 to 500 nm.

8. A Group III nitride semiconductor element according to claim 7, wherein said second nitride semiconductor layer has a thickness of 1 to 400 nm.

9. A Group III nitride semiconductor element according to claim 8, wherein said second nitride semiconductor layer has a thickness of 1 to 300 nm.

10. A Group III nitride semiconductor element according to claim 1, wherein said second nitride semiconductor layer is composed of an undoped semiconductor.

11. A Group III nitride semiconductor light-emitting device comprising a Group III nitride semiconductor element according to claim 1, wherein:
    the fourth nitride semiconductor layer further includes a p-type layer provided on said a light-emitting layer,
    a negative electrode provided on said n-type contact layer; and
    a positive electrode provided on said p-type layer.

12. A light-emitting diode comprising a Group III nitride semiconductor light-emitting device according to claim 11.

13. A laser diode comprising a Group III nitride semiconductor light-emitting device according to claim 11.

14. A semiconductor device comprising a Group III nitride semiconductor element according to claim 1.

* * * * *